(12) United States Patent
Amemiya

(10) Patent No.: US 11,609,285 B2
(45) Date of Patent: Mar. 21, 2023

(54) METHOD, METHOD OF INSPECTING MAGNETIC DISK DEVICE, AND ELECTRONIC COMPONENT

(71) Applicants: Kabushiki Kaisha Toshiba, Tokyo (JP); Toshiba Electronic Devices & Storage Corporation, Tokyo (JP)

(72) Inventor: Yoshihiro Amemiya, Chigasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 148 days.

(21) Appl. No.: 17/012,230

(22) Filed: Sep. 4, 2020

(65) Prior Publication Data
US 2021/0286030 A1  Sep. 16, 2021

(30) Foreign Application Priority Data
Mar. 13, 2020  (JP) .............................. JP2020-044029

(51) Int. Cl.
| | |
|---|---|
| *G01R 33/12* | (2006.01) |
| *G01R 1/067* | (2006.01) |
| *G01R 31/28* | (2006.01) |
| *G01R 31/309* | (2006.01) |

(52) U.S. Cl.
CPC ......... *G01R 33/1207* (2013.01); *G01R 1/067* (2013.01); *G01R 31/2808* (2013.01); *G01R 31/309* (2013.01)

(58) Field of Classification Search
None
See application file for complete search history.

(56) References Cited

U.S. PATENT DOCUMENTS

| | | | |
|---|---|---|---|
| 6,449,748 B1 | 9/2002 | Jeng et al. | |
| 6,459,272 B1 * | 10/2002 | Yamashita | ......... G01R 31/2805 324/763.01 |
| 7,251,766 B2 | 7/2007 | Kato | |
| 10,262,911 B1 | 4/2019 | Gong et al. | |
| 2003/0053257 A1 * | 3/2003 | Wada | ..................... G11B 5/486 360/245.9 |
| 2009/0207529 A1 * | 8/2009 | Yao | ..................... H05K 1/0268 360/245.9 |

* cited by examiner

*Primary Examiner* — Nasima Monsur
(74) *Attorney, Agent, or Firm* — Allen & Overy LLP

(57) ABSTRACT

According to one embodiment, a method includes: supplying electrical energy to a first path by an inspection circuit with a short circuit between two first terminals through a first probe; and detecting an electrical characteristic on the first path by the inspection circuit. The two first terminals are included in a plurality of second terminals included in a flexible printed circuit board. The flexible printed circuit board includes: an electronic component including the inspection circuit and a plurality of third terminals; the plurality of second terminals; and a plurality of first wired lines connecting the plurality of second terminals and the plurality of third terminals. The first path is formed by: the two first terminals; two second wired lines connected to the two first terminals among the plurality of first wired lines; and two fourth terminals connected to the two second wired lines among the plurality of third terminals.

4 Claims, 14 Drawing Sheets

FIG.1
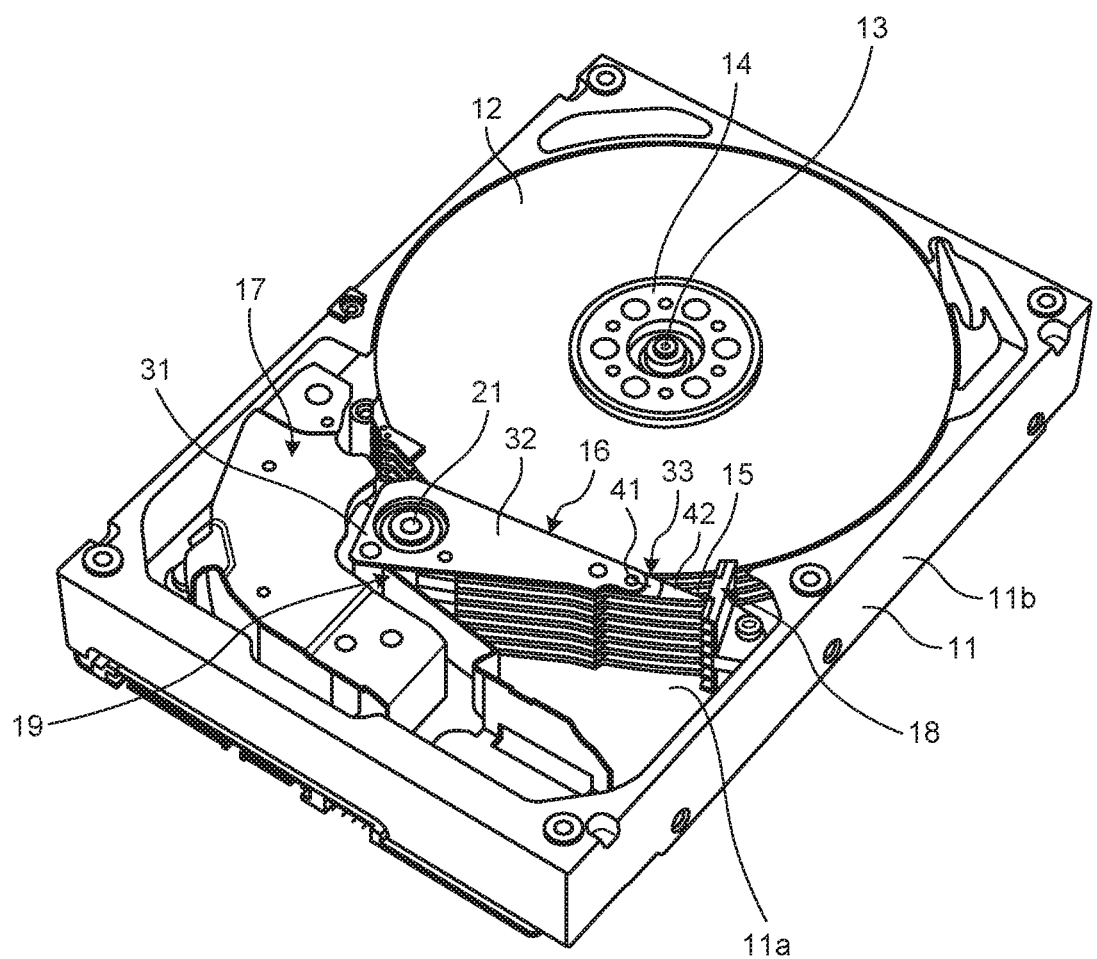

METHOD, METHOD OF INSPECTING MAGNETIC DISK DEVICE, AND ELECTRONIC COMPONENT

CROSS-REFERENCE TO RELATED APPLICATIONS

This application is based upon and claims the benefit of priority from Japanese Patent Application No. 2020-004429, filed on Mar. 13, 2020, the entire contents of which are incorporated herein by reference.

FIELD

Embodiments described herein relate generally to a method, a method of inspecting a magnetic disk device, and an electronic component.

BACKGROUND

A magnetic disk device such as a hard disk drive (HDD) includes magnetic disks and magnetic heads that read information from and write information to the magnetic disks. For example, a flexible printed circuit (FPC) board makes electrical connection between the magnetic heads and a control device that controls the HDD. The FPC board includes an electronic component that functions as a pre-amplifier. In addition, the FPC board includes a plurality of pads to which the magnetic heads are connected.

Conventionally, carried out is mounting inspection for verification of whether or not the preamplifier has been properly mounted on the FPC. In the mounting inspection, an electrical characteristic is detected with a probe in accurate contact with each of the plurality of pads, resulting in verification of whether or not an unintended short circuit, disconnection, un-junction, or the like has occurred. However, because the number of pads provided on the FPC has increased recently, it has become increasingly difficult to make a probe come in accurate contact with each pad. Therefore, it has become increasingly difficult to acquire a stable inspection result.

BRIEF DESCRIPTION OF THE DRAWINGS

FIG. 1 is an exemplary perspective view schematically illustrating a hard disk drive according to a first embodiment;

DETAILED DESCRIPTION

Figure 2:
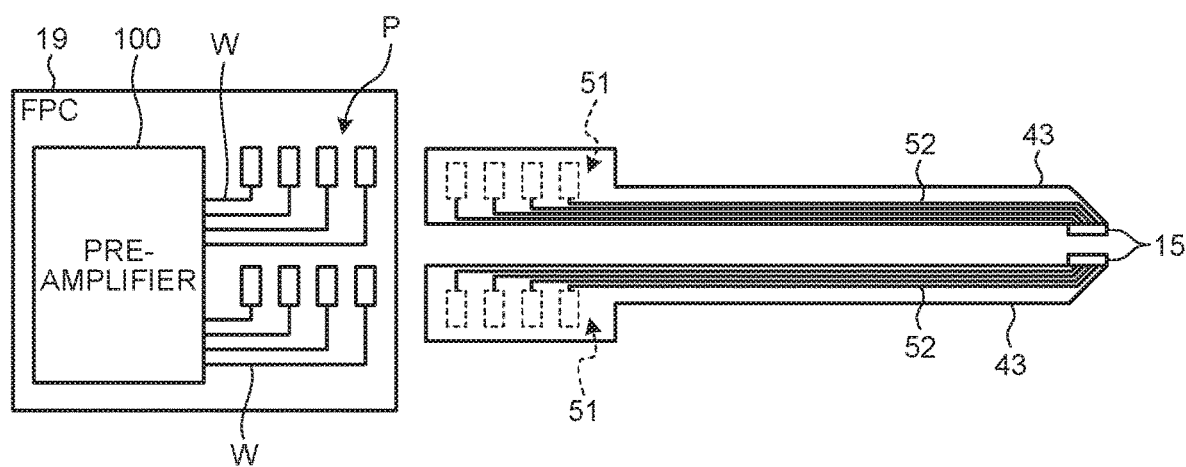
FIG. 2 is an exemplary view schematically illustrating a flexible printed circuit (FPC) board and flexures according to the first embodiment.

According to the present embodiment, a method includes: supplying electrical energy to a first path by an inspection circuit with a short circuit between two first terminals through a first probe; and detecting an electrical characteristic on the first path by the inspection circuit when the electrical energy is supplied to the first path. The two first terminals are included in a plurality of second terminals included in a flexible printed circuit board. The flexible printed circuit board includes: an electronic component including the inspection circuit and a plurality of third terminals; the plurality of second terminals; and a plurality of first wired lines connecting the plurality of second terminals and the plurality of third terminals. The first path is formed by: the two first terminals; two second wired lines connected to the two first terminals among the plurality of first wired lines; and two fourth terminals connected to the two second wired lines among the plurality of third terminals.

A method, a method of inspecting a magnetic disk device, and an electronic component according to embodiments will be explained below in detail with reference to the accompanying drawings. The present invention is not limited to the following embodiments.

First Embodiment

FIG. 1 is an exemplary perspective view schematically illustrating a hard disk drive (HDD) 1 according to a first embodiment. Note that the present embodiment is not limited to the HDD 1 and thus is applicable to a different magnetic disk device such as a hybrid hard disk drive.

As illustrated in FIG. 1, the HDD 1 includes a casing 11, a plurality of magnetic disks 12, a spindle motor 13, a clamping spring 14, a plurality of magnetic heads 15, an actuator assembly 16, a voice coil motor 17, a ramp load mechanism 18, and a flexible printed circuit (FPC) board 19.

The casing 11 includes a bottom wall 11a formed in a tabular shape and a side wall 11b protruding from the bottom wall 11a. Furthermore, the casing 11 includes a cover that covers the inside of the casing 11, the cover being attached to the side wall 11b. The casing 11 houses therein the magnetic disks 12, the spindle motor 13, the clamping spring 14, the magnetic heads 15, the actuator assembly 16, the voice coil motor 17, the ramp load mechanism 18, and at least part of the FPC board 19.

For example, the magnetic disks 12 each have a magnetic recording layer provided on at least one of upper and lower faces thereof.

The spindle motor 13 supports and rotates the plurality of magnetic disks 12 piled at intervals. The clamping spring 14 retains the plurality of magnetic disks 12 at the hub of the spindle motor 13.

The magnetic heads 15 each record information on and reproduce information from the recording layer of the corresponding magnetic disk 12. In other words, the magnetic heads 15 each read information from or write information to the corresponding magnetic disk 12. The magnetic heads 15 are supported by the actuator assembly 16.

The actuator assembly 16 is pivotably supported by a support shaft 21 disposed at a position apart from the magnetic disks 12. The voice coil motor 17 pivots the actuator assembly 16 to be disposed at a desired position. When the magnetic heads 15 move to the outermost circumferences of the magnetic disks 12 due to the pivot of the actuator assembly 16 by the voice coil motor 17, the ramp load mechanism 18 retains the magnetic heads 15 at the unload position apart from the magnetic disks 12.

A printed circuit board is attached outside the bottom wall 11a of the casing 11. A control device that controls the spindle motor 13, the magnetic heads 15, and the voice coil motor 17, is mounted on the printed circuit board. The control device is electrically connected to the magnetic heads 15 and the voice coil motor 17 through the FPC board 19.

The actuator assembly 16 includes an actuator block 31, a plurality of arms 32, and a plurality of head suspension assemblies 33. The head suspension assembly 33 is also referred to as a head gimbal assembly (HGA).

For example, the actuator block 31 is pivotably supported by the support shaft 21 through a bearing. The plurality of arms 32 protrudes from the actuator block 31 in a direction substantially orthogonal to the support shaft 21. Note that the plurality of arms 32 may respectively protrude from a plurality of actuator blocks 31 due to division of the actuator assembly 16.

The plurality of arms 32 is disposed at intervals in the direction in which the support shaft 21 extends. Each arm 32 is formed in a tabular shape interposable between adjacent magnetic disks 12. The plurality of arms 32 extends substantially parallel.

A projection protruding from the actuator block 31 is provided with the voice coil of the voice coil motor 17.

Each head suspension assembly 33 attached to the leading end of the corresponding arm 32, protrudes from the arm 32. Thus, the plurality of head suspension assemblies 33 is disposed at intervals in the direction in which the support shaft 21 extends.

FIG. 2 is an exemplary view schematically illustrating the FPC board 19 and flexures 43 according to the first embodiment. Each of the plurality of head suspension assemblies 33 includes a baseplate 41 and a load beam 42 illustrated in FIG. 1 and a flexure 43 illustrated in FIG. 2. The magnetic heads 15 are attached to the head suspension assemblies 33.

In the example illustrated in FIG. 2, two flexures 43 are connected to the FPC board 19.

Each of the flexures 43 is formed in an elongate belt shape. Each of the flexures 43 includes four terminals 51, a magnetic head 15, and a wired-line group 52 connecting the four terminals 51 and the magnetic head 15.

A preamplifier 100 is mounted on the FPC board 19. The preamplifier 100 is an exemplary electronic component. In addition, the FPC board 19 includes eight head pads P and eight wired lines W. The eight wired lines W respectively connect the eight head pads P to the preamplifier 100.

The eight terminals 51 in total in the two flexures 43 are connected one-to-one to the eight head pads P in the FPC board 19. This results in electrical connection between the preamplifier 100 and the two magnetic heads 15.

Under control of the control device, the preamplifier 100 applies voltage to a write element, a read element, or the like in each the magnetic head 15. This results in achievement of writing of data to the magnetic disk 12 or reading of data from the magnetic disk 12.

Note that the number of flexures 43 connected to the FPC board 19 is not limited to two. A number of flexures 43, the number of which corresponds to the number of magnetic heads 15, may be connected to the FPC board 19. In addition, the number of the terminals 51 in each the flexure 43 is not limited to four.

In recent years, in order to provide a hard disk drive with as a large storage capacity as possible, the hard disk drive is equipped with as a large number of magnetic disks as possible. A larger number of magnetic disks with which the hard disk drive is equipped need a larger number of magnetic heads. In addition, because the function of a magnetic head has advanced recently, the number of head pads necessary per magnetic head has increased. As described above, the FPC board 19 is provided in practice with a considerably large number of head pads.

In a factory, after production of the FPC board 19, carried out is mounting inspection for verification of whether or not the preamplifier 100 has been properly mounted on the FPC board 19. In a case where a location at which an intended electrical path is not formed is detected between the plurality of head pads P and the preamplifier 100, the result of the mounting inspection shows rejection. In a case where no location at which an intended electrical path is not formed is detected between the plurality of head pads P and the preamplifier 100, the result of the mounting inspection shows acceptance. Then, the FPC board 19 having passed in the mounting inspection is built into a hard disk drive.

However, as described above, because the FPC board 19 is recently provided with a considerably large number of head pads P, it is difficult to make a probe come in accurate contact with each head pad P, so that it is difficult to acquire a stable result.

Therefore, in the embodiment, the preamplifier 100 and an inspection device (inspection device 200) for mounting inspection are provided such that mounting inspection can be carried out with one probe in simultaneous contact with two or more head pads P.

Figure 3:
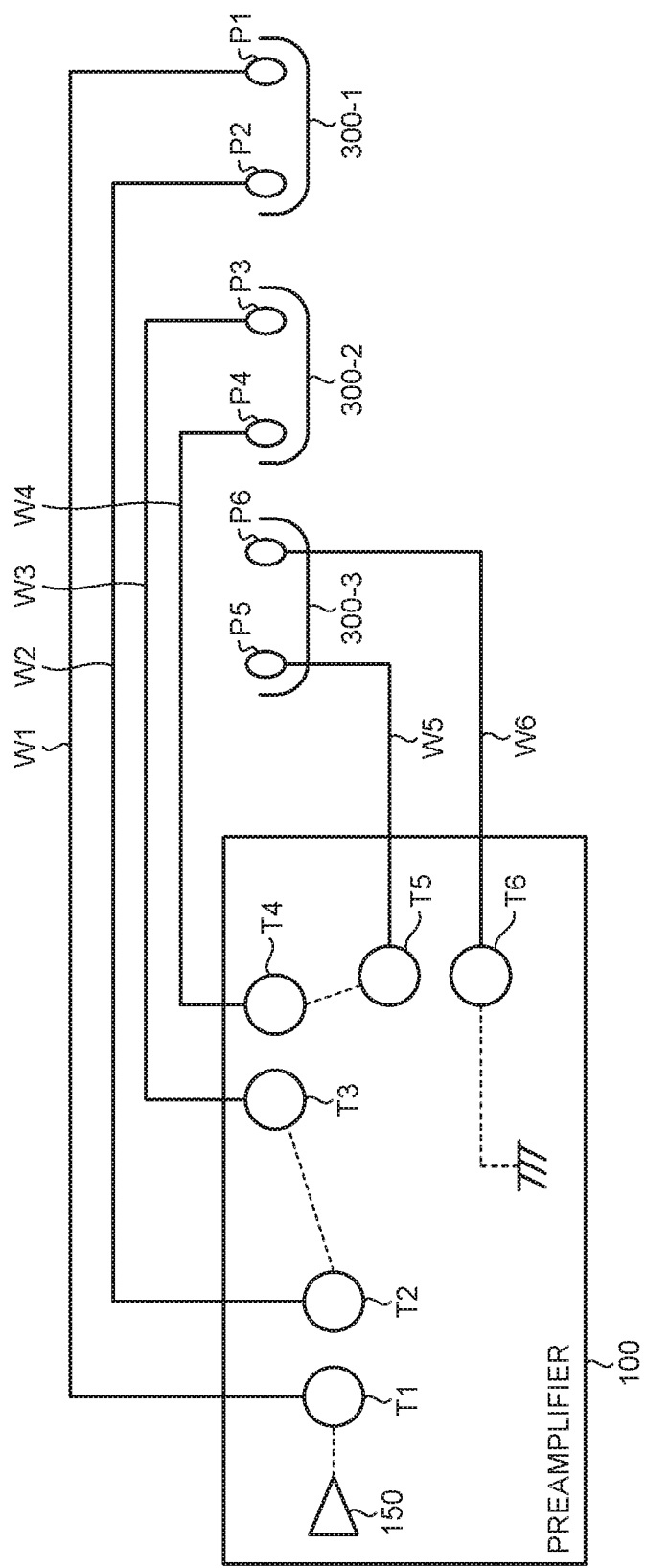
FIG. 3 is a schematic diagram illustrating an exemplary configuration of the FPC board according to the first embodiment.

FIG. 3 is a schematic diagram illustrating an exemplary configuration of the FPC board 19 according to the first embodiment. In the example illustrated in the present diagram, the preamplifier 100 includes six terminals T1 to T6 as a plurality of terminals T. In addition, the FPC board 19 includes six head pads P1 to P6 as a plurality of head pads P. The six terminals T1 to T6 are respectively connected to the six head pads P1 to P6 through six wired lines W1 to W6. In addition, the inspection device 200 includes three probes 300-1 to 300-3 as one or more probes 300.

The preamplifier 100 includes an inspection circuit 150. The inspection circuit 150 is capable of detecting an electrical characteristic of a path connected to the inspection circuit 150 itself. In addition, the preamplifier 100 includes therein one or more switches (not illustrated in FIG. 3). A path whose electrical characteristic is detected can be formed by the one or more switches.

For example, at the time of mounting inspection, made are a connection between the inspection circuit 150 and the terminal T1, a connection between the terminal T2 and the terminal T3, a connection between the terminal T4 and the terminal T5, and a connection between the terminal T6 and the ground potential. The connections (namely, connections indicated with the dotted lines of FIG. 3) are achieved inside the preamplifier 100 by operations for the one or more switches provided in the preamplifier 100. Furthermore, a short circuit between the head pad P1 and the head pad P2, a short circuit between the head pad P3 and the head pad P4, and a short circuit between the head pad P5 and the head pad P6 are made respectively through the probe 300-1, the probe 300-2, and the probe 300-3.

This arrangement results in formation of a path in which the terminal T1, the wired line W1, the head pad P1, the probe 300-1, the head pad P2, the wired line W2, the terminal T2, the terminal T3, the wired line W3, the head pad P3, the probe 300-2, the head pad P4, the wired line W4, the terminal T4, the terminal T5, the wired line W5, the head pad P5, the probe 300-3, the head pad P6, the wired line W6, and the terminal T6 in this order are connected in series. That is the terminals T1 to T6 and the head pads P1 to P6 are connected in a daisy chain. As described above, the path formed by the short circuits through the probes 300 is specified as a first test path.

One end of the first test path is connected to the inspection circuit 150, and the other end of the first test path is connected to the ground potential. If there is no disconnection or un-junction between the six terminals T and the six head pads P, the first test path should be in electrical continuity because of the connection to the ground potential. The inspection circuit 150 supplies current to the first test path and additionally verifies whether or not the current flows on the first test path. On the basis of whether or not the current has been detected on the path, verified is the presence or absence of a disconnection or un-junction between the six terminals T and the six head pads P.

Here, the two head pads P that one of the probes 300 short-circuits may be disposed to be adjacent to each other. As a result, according to the first embodiment, a contact operation by each the probe 300 is simpler, in comparison to a method of making a probe individually come in contact with each head pad, so that a stable inspection result can be acquired.

Note that the first test path may include all the head pads P included in the FPC board 19 or may include only part of the plurality of head pads P included in the FPC board 19. In addition, a plurality of first test paths may be formed on the FPC board 19.

For example, provided may be one first test path in which the terminal T1, the wired line W1, the head pad P1, the probe 300-1, the head pad P2, the wired line W2, and the terminal T2 are connected in series and another first test path in which the terminal T3, the wired line W3, the head pad P3, the probe 300-2, the head pad P4, the wired line W4, the terminal T4, the terminal T5, the wired line W5, the head pad P5, the probe 300-3, the head pad P6, the wired line W6, and the terminal T6 are connected in series.

In a case where a plurality of first test paths is formed, the inspection circuit 150 may be provided every first test path. Alternatively, one inspection circuit 150 may be shared among the plurality of first test paths. In a case where one inspection circuit 150 is shared among the plurality of first test paths, electrical characteristics of the plurality of first test paths are respectively detected in different periods. A switch may be provided between the plurality of first test paths and the inspection circuit 150, and a first test path that is a connection target of the inspection circuit 150 may be selected by switching of the switch.

Figure 4:
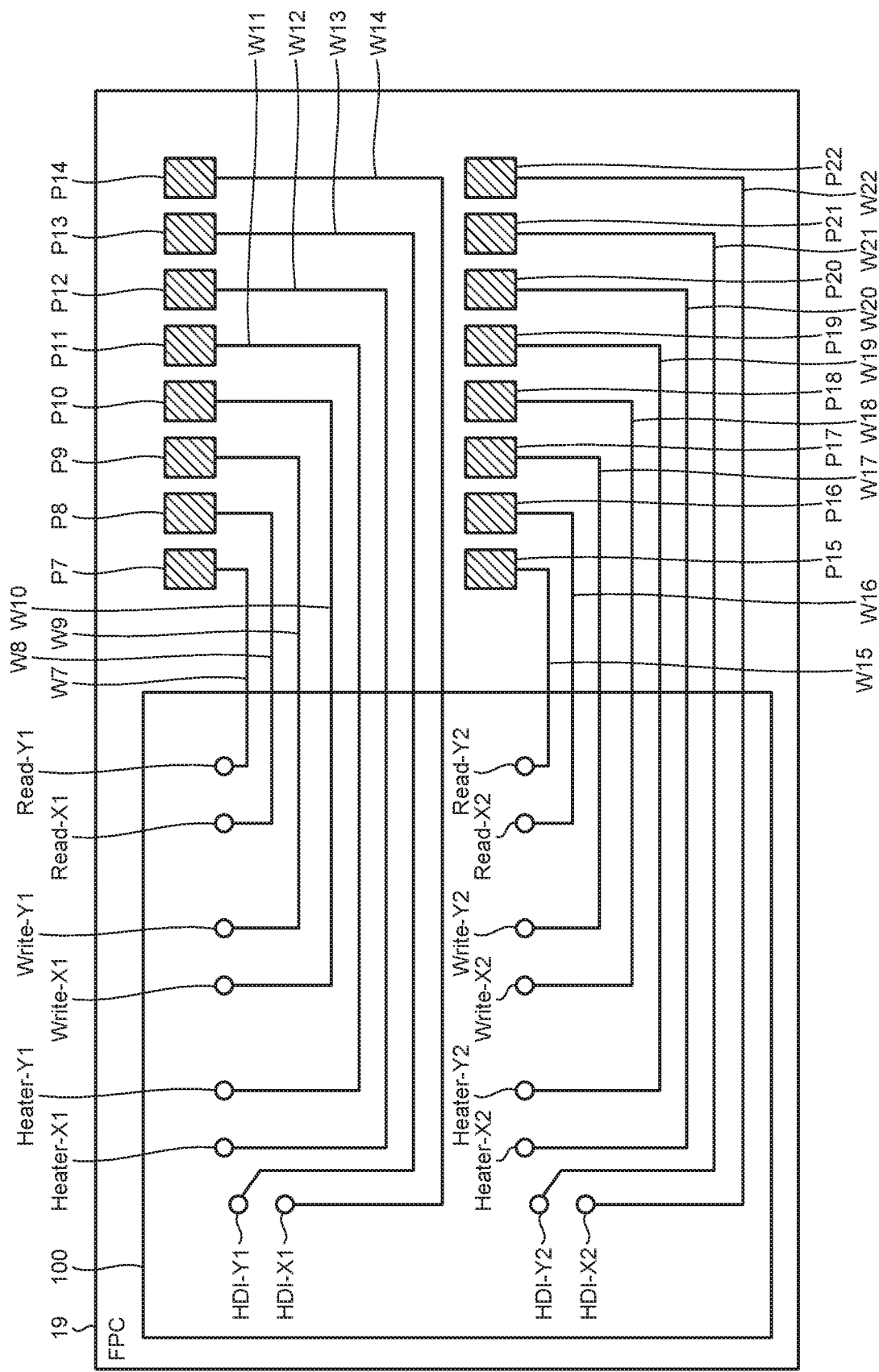
FIG. 4 is a schematic diagram illustrating an exemplary specific configuration of the FPC board according to the first embodiment.
Figure 5:
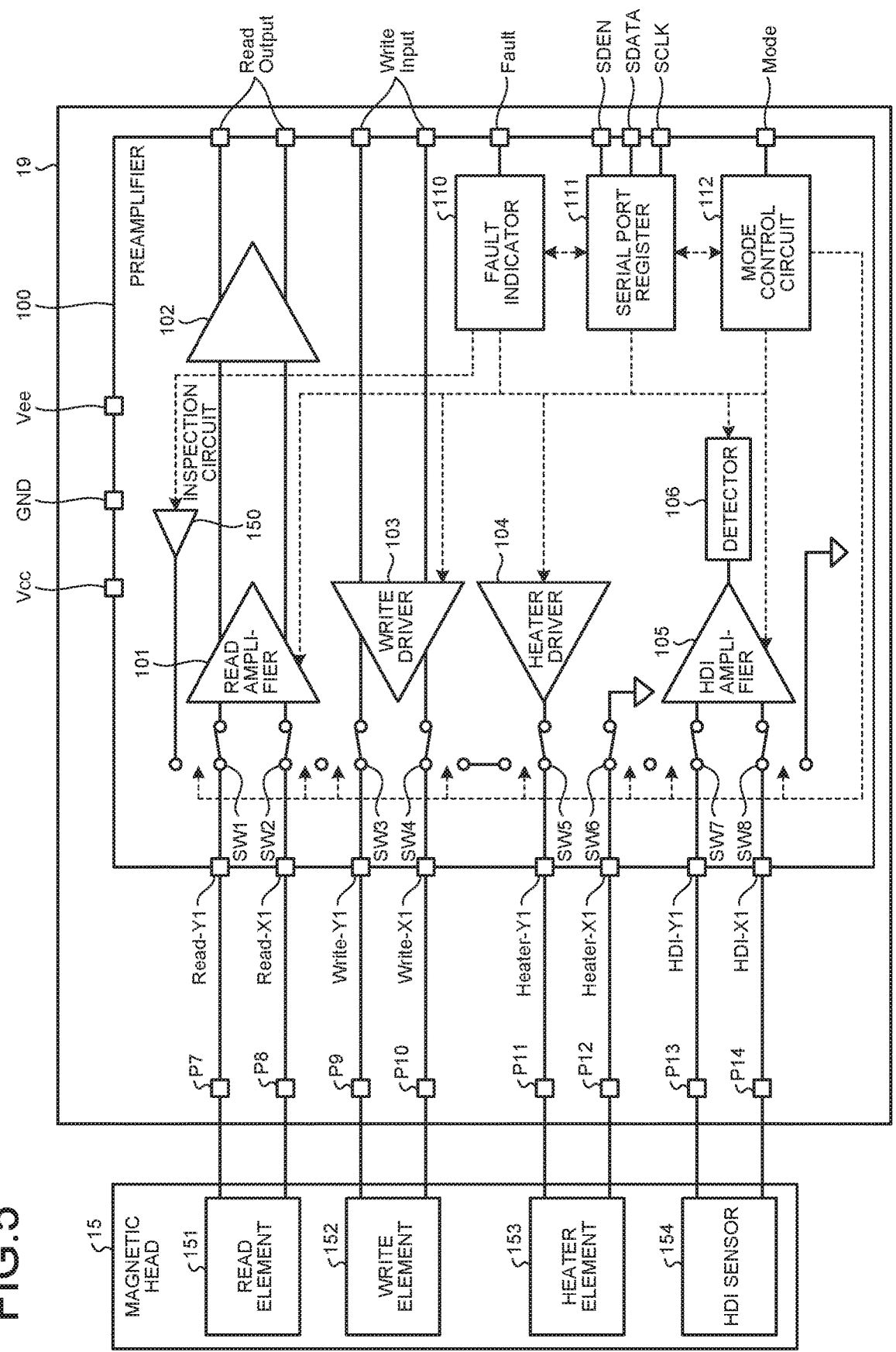
FIG. 5 is a schematic diagram illustrating an exemplary specific configuration of a preamplifier mounted on the FPC board according to the first embodiment.

FIG. 4 is a schematic diagram illustrating an exemplary specific configuration of the FPC board 19 according to the first embodiment. FIG. 5 is a schematic diagram illustrating an exemplary specific configuration of the preamplifier 100 mounted on the FPC board 19 according to the first embodiment.

In the examples illustrated in FIGS. 4 and 5, the FPC board 19 includes 16 head pads P7 to P22 as a plurality of head pads P. The head pads P7 to P14 are connected to one magnetic head 15. The head pads P15 to P22 are connected to another magnetic head 15.

The head pads P7 and P8 are connected to a read element 151 in the magnetic head 15. The head pads P9 and P10 are connected to a write element 152 in the magnetic head 15. The head pads P11 and P12 are connected to a heater element 153 in the magnetic head 15. The heater element 153 heats the magnetic head 15 to control the thermal expansion of the magnetic head 15. The head pads P13 and P14 are connected to an HDI sensor 154 in the magnetic head 15. The HDI sensor 154 detects contact between the magnetic head 15 and the magnetic disk 12.

The head pads P15 and P16 are connected to a read element 151 in the another magnetic head 15. The head pads P17 and P18 are connected to a write element 152 in the another magnetic head 15. The head pads P19 and P20 are connected to a heater element 153 in the another magnetic head 15. The head pads P21 and P22 are connected to an HDI sensor 154 in the another magnetic head 15.

The preamplifier 100 includes a terminal Read-Y1 as a terminal T connected to the head pad P7 through a wired line W7, a terminal Read-X1 as a terminal T connected to the head pad P8 through a wired line W8, a terminal Write-Y1 as a terminal T connected to the head pad P9 through a wired line W9, a terminal Write-X1 as a terminal T connected to the head pad P10 through a wired line W10, a terminal Heater-Y1 as a terminal T connected to the head pad P11 through a wired line W11, a terminal Heater-X1 as a terminal T connected to the head pad P12 through a wired line W12, a terminal HDI-Y1 as a terminal T connected to the head pad P13 through a wired line W13, and a terminal HDI-X1 as a terminal T connected to the head pad P14 through a wired line W14.

In addition, the preamplifier 100 includes a terminal Read-Y2 as a terminal T connected to the head pad P15 through a wired line W15, a terminal Read-X2 as a terminal T connected to the head pad P16 through a wired line W16, a terminal Write-Y2 as a terminal T connected to the head pad P17 through a wired line W17, a terminal Write-X2 as a terminal T connected to the head pad P18 through a wired line W18, a terminal Heater-Y2 as a terminal T connected to the head pad P19 through a wired line W19, a terminal Heater-X2 as a terminal T connected to the head pad P20 through a wired line W20, a terminal HDI-Y2 as a terminal T connected to the head pad P21 through a wired line W21, and a terminal HDI-X2 as a terminal T connected to the head pad P22 through a wired line W22.

As illustrated in FIG. 5, the preamplifier 100 includes a read amplifier 101, an amplifier 102, a write driver 103, a heater driver 104, an HDI amplifier 105, a detector 106, an inspection circuit 150, switches SW1 to SW8 as the one or more switches mentioned in the description of FIG. 3, a fault indicator 110, a serial port register 111, and a mode control circuit 112.

Note that, in FIG. 5, for easy viewing of the drawing, the drawing of a configuration corresponding to connection to the magnetic head 15 through the head pads P15 to P22 is omitted in the configuration of the FPC board 19.

In addition to the terminals T connected to the head pads P, the preamplifier 100 includes a Vcc terminal and a Vee terminal to which the power-supply potential is input, a GND terminal to which the ground potential is input, a pair of ReadOutput terminals from which read data is output, a pair of WriteInput terminals to which write data is input, a Fault terminal through which the fault indicator 110 outputs a notification of the presence or absence of a fault, an SDATA terminal to which control information for control of the preamplifier 100 is input, an SDEN terminal to which an enable signal indicating whether or not the input of the control information is active is input, an SCLK terminal to which a clock signal of driving the preamplifier 100 is input, and a Mode terminal to which a command for one operation mode among a plurality of operation modes is input.

The plurality of operation modes includes a read mode, a write mode, and a test mode. In the hard disk drive 1, a group of the terminals is connected to, for example, the control device provided on the printed circuit board, and the preamplifier 100 operates in the read mode or the write mode, on the basis of an input from the control device through the Mode terminal. The read mode and the write mode are collectively referred to as a normal mode.

In the normal mode, the terminals Read-Y1 and Read-X1 are in connection with a pair of input terminals of the read amplifier 101 through the switches SW1 and SW2, respectively. A pair of output terminals of the read amplifier 101 is in connection with the pair of ReadOutput terminals through the amplifier 102.

Furthermore, the pair of WriteInput terminals is in connection with the terminals Write-X1 and Write-Y1 through the write driver 103 and the switches SW3 and SW4.

Furthermore, the output terminal of the heater driver 104 is in connection with the terminal Heater-Y1 through the switch SW5. The terminal Heater-X1 is in connection with the ground potential through the switch SW6.

Furthermore, the terminals HDI-Y1 and HDI-X1 are in connection with a pair of input terminals of the HDI amplifier 105 through the switches SW7 and SW8, respectively. The output terminal of the HDI amplifier 105 is in connection with the detector 106 that determines whether or not the magnetic head 15 is in contact with the magnetic disk 12.

In the read mode, the mode control circuit 112 controls each constituent element such that a pair of read signals input through the terminals Read-Y1 and Read-X1 is output from the pair of ReadOutput terminals through the read amplifier 101 and the amplifier 102.

In the write mode, the mode control circuit 112 controls each constituent element such that signals input through the pair of WriteInput terminals are output as a pair of write signals from the terminals Write-X1 and Write-Y1 through the write driver 103.

In the normal mode, the control device inputs signals to the SDATA terminal, the SDEN terminal, and the SCLK terminal, so that the operation of the preamplifier 100 can be controlled.

In addition, in the normal mode, a fault detector not illustrated monitors the operations of some constituent elements. In a case where the fault detector detects a fault, the fault indicator 110 is notified that the fault has been detected, so that the fault indicator 110 can output, as a Fault signal, the notification that the fault has been detected.

At the time of mounting inspection of the FPC board 19, the Vcc terminal, the Vee terminal, the GND terminal, the ReadOutput terminals, the WriteInput terminals, the Fault terminal, the SDATA terminal, the SDEN terminal, the SCLK terminal, and the Mode terminal are connected to, for example, the inspection device. The preamplifier 100 operates in the test mode, on the basis of an input from the inspection device through the Mode terminal.

Figure 6:
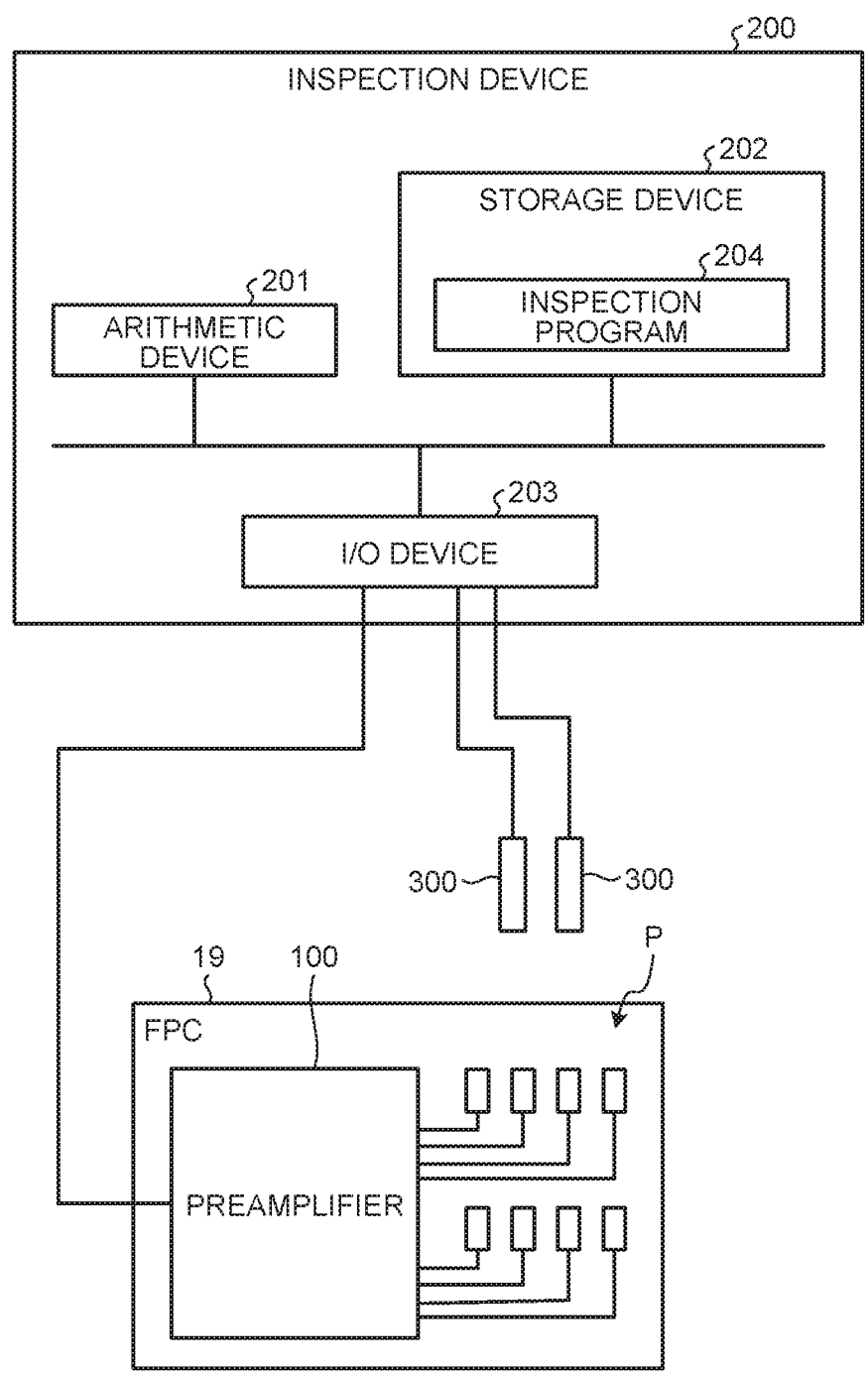
FIG. 6 is a schematic diagram illustrating an exemplary configuration of an inspection device according to the first embodiment.

FIG. 6 is a schematic diagram illustrating an exemplary configuration of the inspection device 200 according to the first embodiment. In the example illustrated in the present diagram, the inspection device 200 includes an arithmetic device 201, a storage device 202, and an I/O device 203.

The arithmetic device 201 is a processor, such as a central processing unit (CPU), capable of executing a computer program. The storage device 202 is a memory capable of retaining information. The I/O device 203 is an interface device that connects the inspection device 200 and a component outside the inspection device 200. The arithmetic device 201, the storage device 202, and the I/O device 203 are in electrical connection with a bus.

The ReadOutput terminals, the WriteInput terminals, the Fault terminal, the SDATA terminal, the SDEN terminal, the SCLK terminal, and the Mode terminal of the preamplifier 100 mounted on the FPC board 19 are connected to the I/O device 203. In addition, one or more probes 300 are connected to the I/O device 203.

An inspection program 204 that is a computer program is stored in the storage device 202. The arithmetic device 201 achieves the operation of the inspection device 200, in accordance with the inspection program 204. That is the arithmetic device 201 is capable of transmitting various signals to the preamplifier 100 through the I/O device 203 and is capable of acquiring an inspection result from the preamplifier 100 through the I/O device 203.

Figure 7:
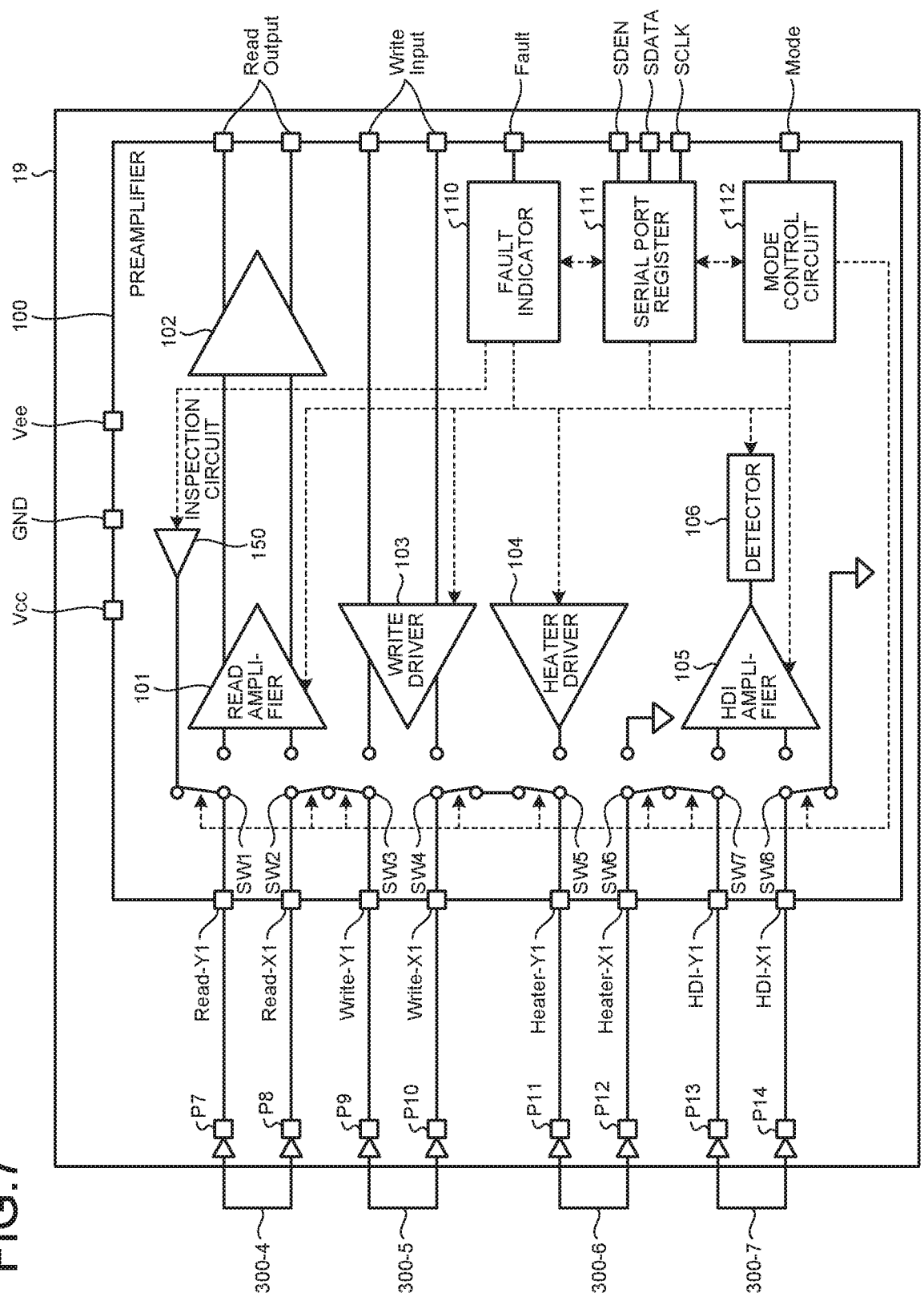
FIG. 7 is a diagram illustrating an exemplary specific configuration of a first test path formed on the FPC board according to the first embodiment.

In the test mode, the first test path is formed. FIG. 7 is a diagram illustrating an exemplary specific configuration of the first test path formed on the FPC board 19 according to the first embodiment.

The mode control circuit 112 turns the switches SW1 to SW8, so that the connection between the terminals Read-Y1 and Read-X1 and the read amplifier 101, the connection between the terminals Write-Y1 and Write-X1 and the write driver 103, the connection between the terminal Heater-Y1 and the heater driver 104, the connection between the terminal Heater-X1 and the ground potential, and the connection between the terminals HDI-Y1 and HDI-X1 and the HDI amplifier 105 are disconnected.

Then, the inspection circuit 150 and the terminal Read-Y1 are connected by the switch SW1. The terminal Read-X1 and the terminal Write-Y1 are connected by the switches SW2 and SW3. The terminal Write-X1 and the terminal Heater-Y1 are connected by the switches SW4 and SW5. The terminal Heater-X1 and the terminal HDI-Y1 are connected by the switches SW6 and SW7. The terminal HDI-X1 and the ground potential are connected by the switch SW8.

In addition, among the plurality of probes 300 included in the inspection device 200, four probes 300-4 to 300-7 each short-circuit two head pads. Specifically, a short circuit between the head pad P7 and the head pad P8, a short circuit between the head pad P9 and the head pad P10, a short circuit between the head pad P11 and the head pad P12, and a short circuit between the head pad P13 and the head pad P14 are made respectively through the probe 300-4, the probe 300-5, the probe 300-6, and the probe 300-7.

This arrangement results in formation of a first test path in which the switch SW1, the terminal Read-Y1, the head pad P7, the probe 300-4, the head pad P8, the terminal Read-X1, the switch SW2, the switch SW3, the terminal Write-Y1, the head pad P9, the probe 300-5, the head pad P10, the terminal Write-X1, the switch SW4, the switch SW5, the terminal Heater-Y1, the head pad P11, the probe 300-6, the head pad P12, the terminal Heater-X1, the switch SW6, the switch SW7, the terminal HDI-Y1, the head pad P13, the probe 300-7, the head pad P14, the terminal HDI-X1, and the switch SW8 in this order are connected in series. Then, one end of the first test path is connected to the inspection circuit 150 by the switch SW1, and the other end of the first test path is connected to the ground potential by the switch SW8.

The inspection circuit 150 supplies current to the first test path and outputs a detection signal indicating an electrical characteristic of the first test path, namely, whether the first test path is in continuity or in discontinuity.

The fault indicator 110 outputs the detection signal through the Fault terminal. The inspection device 200 determines the inspection result, on the basis of the Fault signal received through the Fault terminal.

Figure 8:
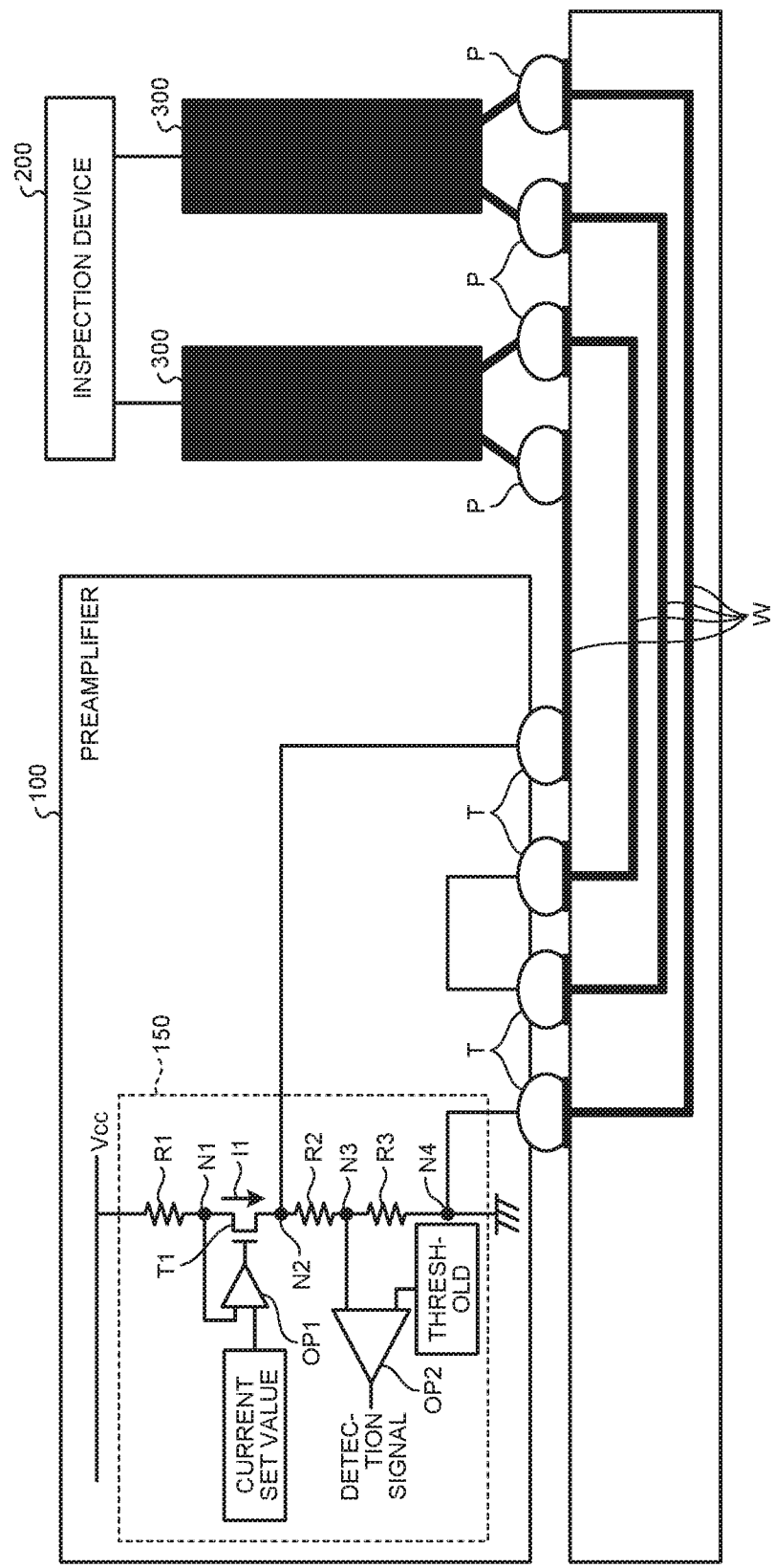
FIG. 8 is a diagram illustrating an exemplary specific configuration of an inspection circuit according to the first embodiment.

FIG. 8 is a diagram illustrating an exemplary specific configuration of the inspection circuit 150 according to the first embodiment. In the example illustrated in the present diagram, the first test path is illustrated in a simplified manner. Specifically, one first test path includes four pads P, four terminals T, and two probes 300. Any switch SW and some constituent elements are omitted in illustration.

The inspection circuit 150 includes a resistor R1, a transistor T1, an operational amplifier OP1, a resistor R2, an operational amplifier OP2, and a resistor R3.

One end of the resistor R1 is in connection with the power-supply potential Vcc, and the other end of the resistor R1 is in connection with a node N1. The node N1 is in connection with the drain of the transistor T1 and the inverting input terminal of the operational amplifier OP1. The non-inverting input terminal of the operational amplifier OP1 receives voltage corresponding to a current set value. The output terminal of the operational amplifier OP1 is in connection with the gate of the transistor T1. That is the resistor R1, the transistor T1, and the operational amplifier OP1 form a constant-current circuit. Current I1 corresponding to the current set value flows between the drain and the source of the transistor T1.

The source of the transistor T1 is in connection with a node N2.

The node N2 is in connection with one end of the resistor R2. The other end of the resistor R2 is in connection with a node N3. The node N3 is in connection with one end of the resistor R3. The other end of the resistor R3 is in connection with a node N4. The node N4 is in connection with the ground potential.

The node N3 is in connection with one of the inverting input terminal and the non-inverting input terminal of the operational amplifier OP2. The other of the inverting input terminal and the non-inverting input terminal of the operational amplifier OP2 receives voltage corresponding to a threshold.

One end of the first test path is in connection with the node N2 through the switch SW1 not illustrated, and the other end of the first test path is in connection with the node N4 through the switch SW8 not illustrated.

In a case where the first test path is in electrical continuity, namely, in a case where no disconnection or no un-junction has occurred in the first test path, most of the current I1 flows through the first test path and the node N4. Therefore, voltage drop due to the resistors R2 and R3 is negligibly small, and thus the voltage at the node N3 is close in value to the ground potential.

In contrast, in a case where the first test path is not in electrical continuity, namely, in a case where a disconnection or un-junction has occurred in the first test path, most of the current I1 flows through the resistor R2 and the resistor R3. Voltage drop occurs due to the flow of the current I1 through the resistors R2 and R3, and thus the voltage at the node N3 is close in value to I1·R3.

A value between the ground potential and I1·R3 is set as the threshold such that the operational amplifier OP2 outputs mutually different values in a case where the voltage at the node N3 is close to the ground potential and in a case where the voltage at the node N3 is close to I1·R3. This arrangement enables output of the detection signal varying in level between a case where the first test path is in continuity and a case where the first test path is in discontinuity, from the output terminal of the operational amplifier OP2.

Note that, according to the example illustrated in FIG. 8, the inspection circuit 150 supplies the predetermined current I1 to the first test path. The inspection circuit 150 may supply predetermined voltage to the first test path. That is the inspection circuit 150 may supply electrical energy to the first test path.

In addition, according the example illustrated in FIG. 8, it is determined whether or not the first test path is in continuity, on the basis of the comparison between the voltage at the node N3 and the threshold. However, the method of determining whether or not the first test path is in continuity is not limited to the above.

Figure 9:
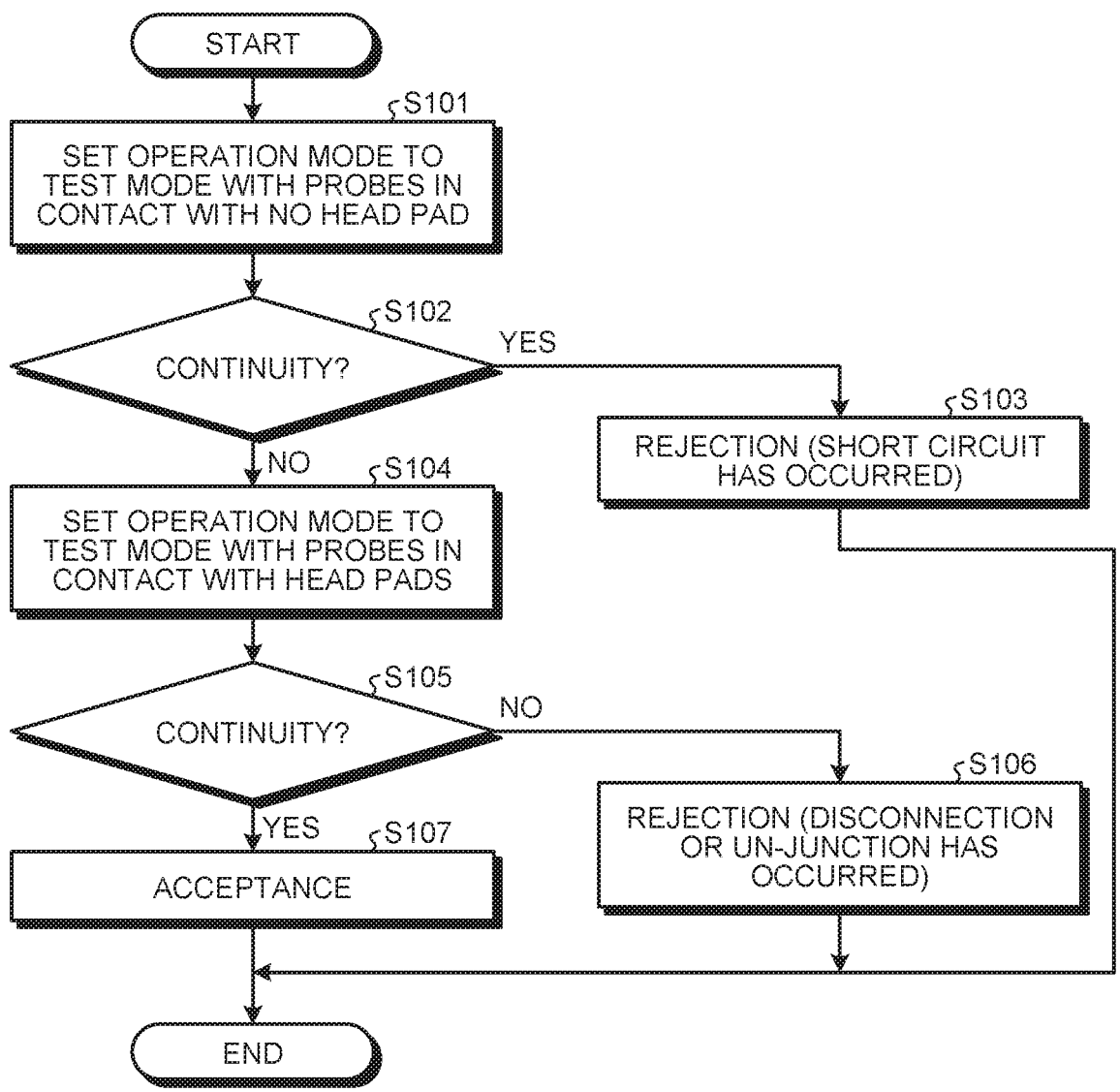
FIG. 9 is a flowchart illustrating an exemplary procedure of mounting inspection according to the first embodiment.

FIG. 9 is a flowchart illustrating an exemplary procedure of mounting inspection according to the first embodiment.

First, the inspection device 200 is connected to the preamplifier 100 on the target FPC board 19. Then, with each probe 300 in contact with no head pad, the inspection device 200 sets the operation mode of the preamplifier 100 to the test mode (S101).

In the example illustrated in FIG. 5, in S101, the mode control circuit 112 transmits a switching signal to each of the switches SW1 to SW8, so that the switches SW1 to SW8 change to the state illustrated in FIG. 7. However, in S101, because the probe 300-4 has not made a short circuit between the head pad P7 and the head pad P8, the inspection circuit 150 is connected to a path including the switch SW1, the terminal Read-Y1, and the head pad P7. This path with no probe 300 is specified as a second test path.

The inspection circuit 150 supplies current to the second test path and determines whether or not the second test path is in continuity (S102). The inspection circuit 150 outputs the determination result as a detection signal. The detection signal is directly output as a Fault signal to the inspection device 200.

Because the second test path is not in connection with the ground potential, if the preamplifier 100 has been mounted normally, the second test path should be in discontinuity. If the second test path is in continuity, it can be estimated that a short circuit has occurred in the FPC board 19.

In a case where the second test path is in continuity (S102: Yes), because it can be estimated that a short circuit has occurred in the FPC board 19, the inspection device 200 determines that the inspection result according to the target FPC board 19 shows rejection (S103). Then, the mounting inspection to the target FPC board 19 finishes.

In a case where the second test path is not in continuity (S102: No), the inspection device 200 sets the operation mode to the test mode, with each probe 300 in contact with two head pads P (S104). After that, the first test path described with FIG. 7 is formed.

The inspection circuit 150 supplies current to the first test path and determines whether or not the first test path is in continuity (S105). The inspection circuit 150 outputs the determination result as a detection signal. The detection signal is directly output as a Fault signal to the inspection device 200.

If the preamplifier 100 has been mounted normally, the first test path should be in continuity. In a case where the first test path is not in continuity, it can be estimated that a disconnection or un-junction has occurred in the first test path.

In a case where the first test path is not in continuity (S105: No), the inspection device 200 determines that the inspection result according to the target FPC board 19 shows rejection (S106). Then, the mounting inspection to the target FPC board 19 finishes.

In a case where the first test path is in continuity (S105: Yes), the inspection device 200 determines that the inspection result according to the target FPC board 19 shows acceptance (S107). Then, the mounting inspection to the target FPC board 19 finishes.

Note that the inspection device 200 may further carry out a different inspection, and may perform the processing in S107 in a case where no rejection is determined in all the inspections.

As described above, according to the first embodiment, at least one probe 300 short-circuits two head pads P together, resulting in formation of a first test path. The first test path includes the two head pads P short-circuited together by the probe 300, two wired lines W connected to the two head pads P, and two terminals T connected to the two wired lines W. The inspection circuit 150 supplies electrical energy to the first test path and detects an electrical characteristic of the first test path in accordance with the supply of the electrical energy.

Making one probe 300 in contact with two head pads P is easier than making a probe in accurate contact with each head pad P, so that a stable inspection result can be acquired.

In addition, according to the first embodiment, formed is a first test path in which a large number of terminals T and a large number of head pads P are connected in a daisy chain by a plurality of probes 300 and one or more switches. According to the example illustrated in FIG. 7, a path including the terminal Read-Y1, the head pad P7, the probe 300-4, the head pad P8, and the terminal Read-X1, formed by a short circuit between the head pads P7 and P8 through the probe 300-4 and a path including the terminal Write-Y1, the head pad P9, the probe 300-5, the head pad P10, and the terminal Write-X1, formed by a short circuit between the head pads P9 and P10 through the probe 300-5 are connected in series by the switches SW2 and SW3, resulting in formation of a first test path including the terminals T and the head pads P.

A first test path including a large number of terminals T and a large number of head pads P is formed with one or more switches, so that electrical characteristics between the large number of terminals T and the large number of head pads P can be detected at a time. Therefore, mounting inspection can be carried out more efficiently in comparison to a method of detecting an electrical characteristic per head pad P with a probe in contact with each head pad P.

Second Embodiment

The difference between a second embodiment and the first embodiment will be described. The duplication between the second embodiment and the first embodiment will be described in a simplified manner or the description thereof will be omitted. An FPC board according to the second embodiment is specified as an FPC board 19a. A preamplifier as an electronic component according to the second embodiment that is mounted on the FPC board 19a is specified as a preamplifier 100a. An inspection device according to the second embodiment is specified as an inspection device 200a.

Figure 10:
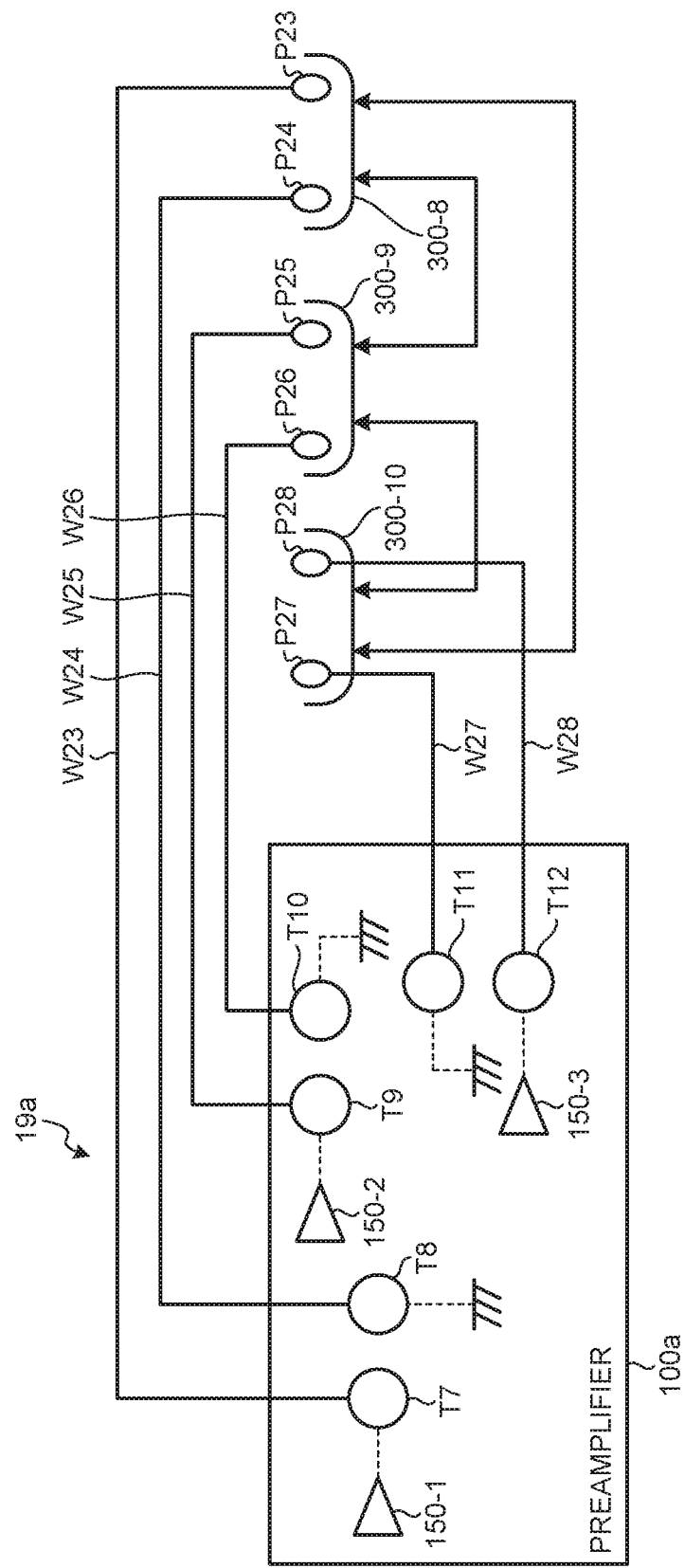
FIG. 10 is a schematic diagram illustrating an exemplary configuration of an FPC board according to a second embodiment.

FIG. 10 is a schematic diagram illustrating an exemplary configuration of the FPC board 19a according to the second embodiment. In the example illustrated in the present diagram, the preamplifier 100a includes six terminals T7 to T12 as a plurality of terminals T. In addition, the FPC board 19a includes six head pads P23 to P28 as a plurality of head pads P. The six terminals T7 to T12 are in connection with the six head pads P23 to P28 through six wired lines W23 to W28, respectively.

In a normal mode, the six terminals T7 to T12 are connected to constituent elements used in the normal mode, such as a read amplifier 101, a write driver 103, a heater driver 104, and an HDI amplifier 105 (not illustrated), among the constituent elements included in the preamplifier 100a. Note that not only those constituent elements but also a fault indicator 110, a serial port register 111, and a mode control circuit 112 are omitted in illustration.

The preamplifier 100a includes three inspection circuits 150-1 to 150-3 as a plurality of inspection circuits 150. For example, each inspection circuit 150 is identical in configuration to the inspection circuit 150 according to the first embodiment. Each inspection circuit 150 is capable of detecting an electric characteristic on a test path connected to the inspection circuit 150 itself.

In addition, the preamplifier 100a includes one or more switches inside. The connections between the six terminals T7 to T12 and the constituent elements used in the normal mode are disconnected by switching of the one or more switches. Then, connections indicated with dotted lines are achieved, resulting in formation of three first test paths.

Herein, formed are a first test path in which the terminal T7, the wired line W23, the head pad P23, a probe 300-8, the head pad P24, the wired line W24, and the terminal T8 are connected in series, a first test path in which the terminal T9, the wired line W25, the head pad P25, a probe 300-9, the head pad P26, the wired line W26, and the terminal T10 are connected in series, and a first test path in which the terminal T11, the wired line W27, the head pad P27, a probe 300-10, the head pad P28, the wired line W28, and the terminal T12 are connected in series. One end of each first test path is connected to any of the three inspection circuits 150-1 to 150-3 through a switch, and the other end of each first test path is connected to the ground potential through a switch.

The inspection device 200a selects two from the three probes 300-8 to 300-10, and detects an electrical characteristic between the selected two probes 300.

For example, the inspection device 200a determines whether or not there is continuity between the probe 300-8 and the probe 300-9, whether or not there is continuity between the probe 300-9 and the probe 300-10, and whether or not there is continuity between the probe 300-10 and the probe 300-8. In a case where it is determined that there is continuity between the probes 300 in any of the combinations, it can be estimated that an unintended short circuit has occurred. Thus, the inspection device 200a determines that the inspection result according to the FPC board 19a having been inspected shows rejection.

As described above, according to the second embodiment, in a test mode, two or more first test paths that have not been short-circuited together are formed. The inspection device 200a detects an electrical characteristic between the probe 300 included in one first test path and the probe 300 included in another first test path.

Note that the configuration illustrated in FIG. 10 is exemplary. For example, the number of terminals T, the number of wired lines W, the number of head pads P, the number of first test paths, and the number of probes 300 are not limited to the example illustrated in FIG. 10.

Figure 11:
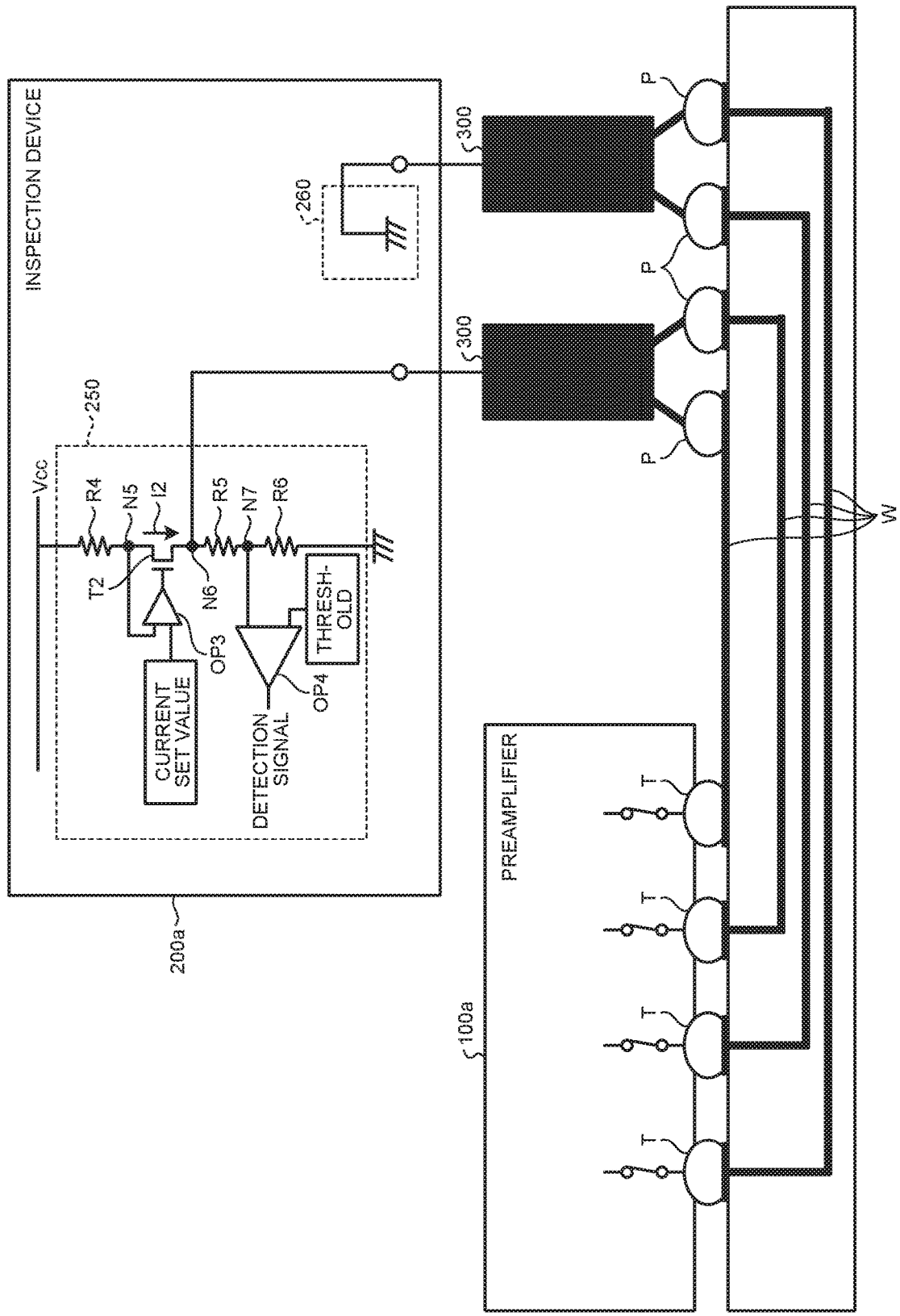
FIG. 11 is a schematic diagram illustrating an exemplary configuration for determination of whether or not there is continuity between probes, which are provided in an inspection device according to the second embodiment.

FIG. 11 is a schematic diagram illustrating an exemplary configuration for determination of whether or not there is continuity between probes 300, which are provided in the inspection device 200a according to the second embodiment.

The inspection device 200a is provided with an inspection circuit 250 and a ground circuit 260 for connection to the ground potential. The probe 300-8, the probe 300-9, and the probe 300-10 can be each connected to either the inspection circuit 250 or the ground circuit 260 by switching of a switch not illustrated. For example, at the time of detection of an electrical characteristic between the probe 300-8 and the probe 300-9, the inspection circuit 250 is connected to the probe 300-8, and the ground circuit 260 is connected to the probe 300-9. In addition, at the time of detection of an electrical characteristic between the probe 300-9 and the probe 300-10, the inspection circuit 250 is connected to the probe 300-9, and the ground circuit 260 is connected to the probe 300-10. At the time of detection of an electrical characteristic between the probe 300-10 and the probe 300-8, the inspection circuit 250 is connected to the probe 300-10, and the ground circuit 260 is connected to the probe 300-8. Note that the respective destinations of two probes 300 to be detected in electrical characteristic are not limited to the example described herein.

The inspection circuit 250 includes a resistor R4, a transistor T2, an operational amplifier OP3, a resistor R5, an operational amplifier OP4, and a resistor R6.

One end of the resistor R4 is in connection with the power-supply potential Vcc, and the other end of the resistor R4 is in connection with a node N5. The node N5 is in connection with the drain of the transistor T2 and the inverting input terminal of the operational amplifier OP3. The non-inverting input terminal of the operational amplifier OP3 receives voltage corresponding to a current set value. The output terminal of the operational amplifier OP3 is in connection with the gate of the transistor T2. That is the resistor R4, the transistor T2, and the operational amplifier OP3 form a constant-current circuit. This arrangement results in a flow of current I2 corresponding to the current set value between the drain and the source of the transistor T2.

The source of the transistor T2 is in connection with a node N6.

The node N6 is in connection with one end of the resistor R5. The other end of the resistor R5 is in connection with a node N7. The node N7 is in connection with one end of the resistor R6. The other end of the resistor R6 is in connection with the ground potential.

The node N7 is in connection with one of the inverting input terminal and the non-inverting input terminal of the operational amplifier OP4. The other of the inverting input terminal and the non-inverting input terminal of the operational amplifier OP4 receives voltage corresponding to a threshold.

One of two probes 300 to be detected in electrical characteristic is connected to the node N6, and the other one of the two probes 300 is connected to the ground circuit 260. The selected two probes 300 are specified as paired target probes 300.

In a case where the paired target probes 300 are in electrical continuity, namely, in a case where a short circuit has occurred between the respective first test paths to which the paired target probes 300 belong, most of the current I2 flows to the probes 300. Because hardly current flows through the resistors R5 and R6, the voltage at the node N7 is close in value to the ground potential.

In contrast, in a case where the paired target probes 300 are in electrical discontinuity, namely, in a case where no short circuit has occurred between the respective first test paths to which the paired target probes 300 belong, most of the current I2 flows through the resistor R5 and the resistor R6. Therefore, the voltage at the node N7 is close in value to approximately I2·R6.

The threshold is set such that mutually different outputs in level are made in a case where the voltage at the node N7 is close to the ground potential and in a case where the voltage at the node N7 is close to I2·R6. This arrangement enables output of a detection signal indicating whether or not there is continuity between the paired target probes 300, from the output terminal of the operational amplifier OP4.

Note that, according to the example illustrated in FIG. 11, the inspection circuit 250 supplies the predetermined current I2 between the two probes 300. The inspection circuit 250 may supply predetermined voltage between the two probes 300. That is the inspection circuit 250 may supply electrical energy between the two probes 300.

In addition, according to the example illustrated in FIG. 11, it is determined whether or not there is continuity between the two probes 300, on the basis of the comparison between the voltage at the node N7 and the threshold. The method of determining whether or not there is continuity between the two probes 300 is not limited to the above.

Figure 12:
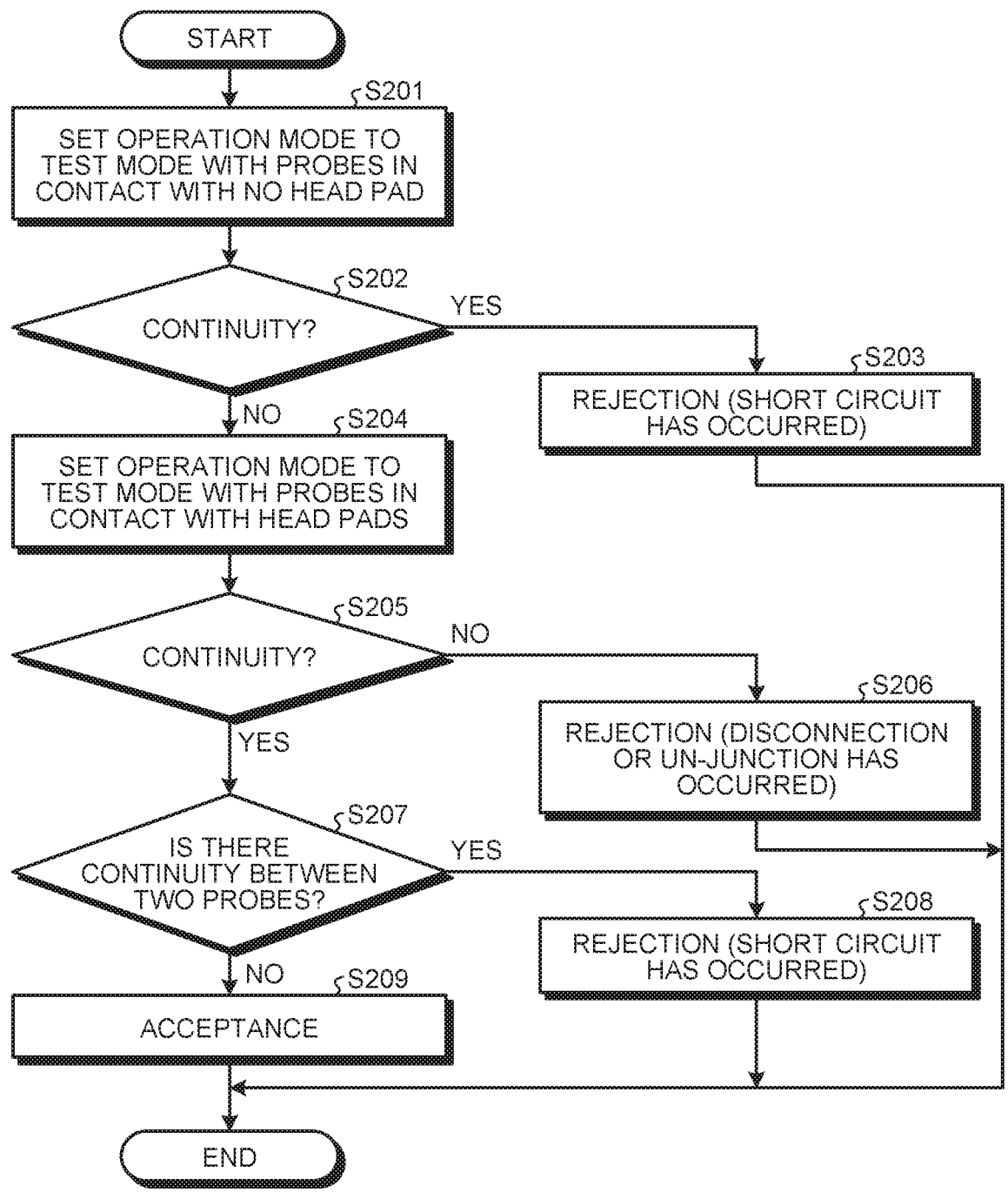
FIG. 12 is a flowchart illustrating an exemplary procedure of mounting inspection according to the second embodiment.

FIG. 12 is a flowchart illustrating an exemplary procedure of mounting inspection according to the second embodiment.

First, the inspection device 200a is connected to the preamplifier 100a on the FPC board 19a. Then, with each probe 300 in contact with no head pad, the inspection device 200a sets the operation mode of the preamplifier 100a to the test mode (S201).

Due to S201, formed are a second test path in which the terminal T7, the wired line W23, and the head pad P23 are connected in series, a second test path in which the terminal T9, the wired line W25, and the head pad P25 are connected in series, and a second test path in which the terminal T12, the wired line W28, and the head pad P28 are connected in series.

Each inspection circuit 150 supplies current to the corresponding second test path and determines whether or not the corresponding second test path is in continuity (S202). Each inspection circuit 150 outputs the determination result as a detection signal. Each detection signal is directly output as a Fault signal to the inspection device 200a.

Because each second test path is not in connection with the ground potential, if the preamplifier 100a has been mounted normally, each second test path should be in discontinuity. If any of the second test paths is in continuity, it can be estimated that an unintended short circuit has occurred in the FPC board 19a.

In a case where any of the second test paths is in continuity (S202: Yes), the inspection device 200a determines that the inspection result according to the FPC board 19a shows rejection (S203). Then, the mounting inspection to the FPC board 19a finishes.

In a case where the second test paths are each in discontinuity (S202: No), with each probe 300 in contact with two head pads P, the inspection device 200a sets the operation mode to the test mode (S204). After that, for example, the plurality of first test paths described with FIG. 11 is formed.

Each inspection circuit 150 supplies current to the corresponding first test path and determines whether or not the corresponding first test path is in continuity (S205). Each inspection circuit 150 outputs the determination result as a detection signal. Each detection signal is directly output as a Fault signal to the inspection device 200a.

In a case where any of the first test paths is in discontinuity (S205: No), it is estimated that a disconnection or un-junction has occurred. Thus, the inspection device 200a determines that the inspection result according to the FPC board 19a shows rejection (S206). Then, the mounting inspection to the FPC board 19a finishes.

In a case where all the first test paths are in continuity (S205: Yes), the inspection circuit 250 of the inspection device 200a determines whether or not there is continuity between two probes 300 (S207).

Note that the inspection device 200a selects two from the plurality of probes 300, sets the selected two probes 300 as paired target probes 300, and determines whether or not there is continuity between the paired target probes 300. Arbitrary two probes 300 are selected for a combination. The processing in S207 may be performed every possible combination or the processing in S207 may be performed to part of all the possible combinations.

In a case where there is continuity between the two probes 300 in any of the combinations (S207: Yes), it is estimated that an unintended short circuit has occurred. Thus, the inspection device 200a determines that the inspection result according to the FPC board 19a shows rejection (S208). Then, the mounting inspection to the FPC board 19a finishes.

In a case where there is no combination determined that there is continuity between the two probes 300 (S207: No), the inspection device 200a determines that the inspection result according to the FPC board 19a shows acceptance (S209). Then, the mounting inspection to the FPC board 19a finishes.

Note that the inspection device 200a may further carry out a different inspection, and may perform the processing in S209 in a case where no rejection is determined in all the inspections.

As described above, according to the second embodiment, the inspection device 200a supplies electrical energy between two probes 300 each short-circuiting two head pads P, and detects an electrical characteristic between the two probes 300 when the electrical energy is supplied.

This arrangement enables collective detection of electrical characteristics on paths between four head pads P in total short-circuited by two probes 300 and four terminals T connected to the four head pads P through wired lines W.

Third Embodiment

The difference between a third embodiment and the first embodiment will be described. The duplication between the third embodiment and the first embodiment will be described in a simplified manner or the description thereof will be omitted. An FPC board according to the third embodiment is specified as an FPC board 19b. A preamplifier as an electronic component according to the third embodiment that is mounted on the FPC board 19b is specified as a preamplifier 100b. An inspection device according to the third embodiment is specified as an inspection device 200b.

Figure 13:
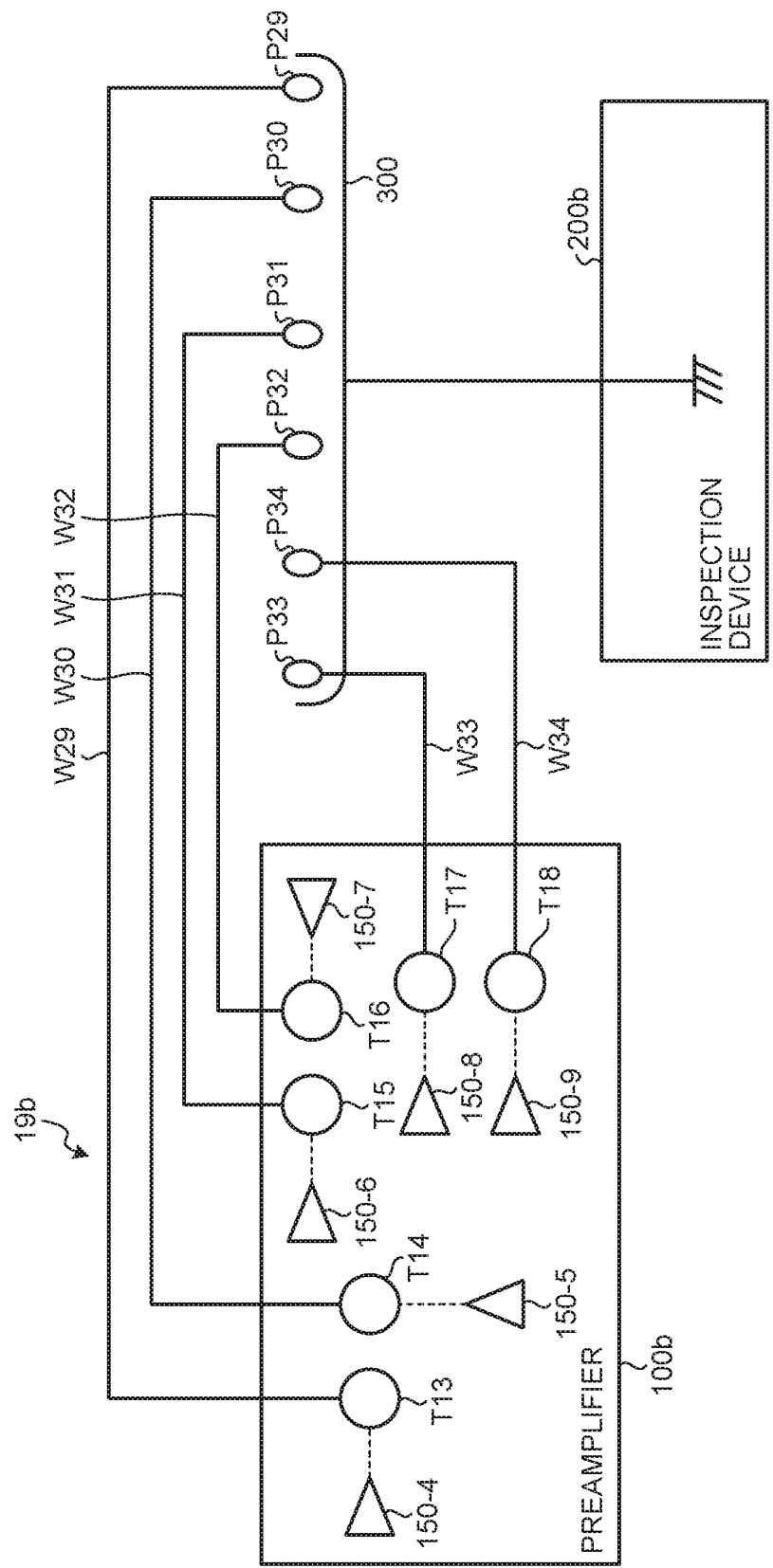
FIG. 13 is a schematic diagram illustrating an exemplary configuration of an FPC board according to a third embodiment.

FIG. 13 is a schematic diagram illustrating an exemplary configuration of the FPC board 19b according to the third embodiment. In the example illustrated in the present diagram, the preamplifier 100b includes six terminals T13 to T18 as a plurality of terminals T. In addition, the FPC board 19b includes six head pads P29 to P34 as a plurality of head pads P. The six terminals T13 to T18 are in connection with the six head pads P29 to P34 through six wired lines W29 to W34, respectively.

According to the third embodiment, every head pad P, detected is an electrical characteristic of a path in which the head pad P, the wired line W, and the terminal T in this order are connected in series. This path is specified as a third test path.

According to the example illustrated in FIG. 13, formed are a third test path in which the head pad P29, the wired line W29, and the terminal T13 are connected in series, a third test path in which the head pad P30, the wired line W30, and the terminal T14 are connected in series, a third test path in which the head pad P31, the wired line W31, and the terminal T15 are connected in series, a third test path in which the head pad P32, the wired line W32, and the terminal T16 are connected in series, a third test path in which the head pad P33, the wired line W33, and the terminal T17 are connected in series, and a third test path in which the head pad P34, the wired line W34, and the terminal T18 are connected in series.

The preamplifier 100b includes six inspection circuits 150-4 to 150-9 as a plurality of inspection circuits 150. Each inspection circuit 150 is capable of detecting an electrical characteristic of a path connected to the inspection circuit 150 itself. In addition, the preamplifier 100b includes one or more switches inside, and the six inspection circuits 150-4 to 150-9 are connected one-to-one to the six terminals T13 to T18 by the one or more switches. This arrangement results in one-to-one connection of the inspection circuits 150 to the six third test paths.

According to the third embodiment, the inspection device 200b includes one probe 300. The probe 300 having a shape for covering the six head pads P29 to P34, is capable of short-circuiting all the six head pads P29 to P34.

In a case where the probe 300 is not in contact with any of the six head pads P, because each third test path is not in connection with the ground potential, if the preamplifier 100b has been mounted properly, each third test path should be in discontinuity. The inspection device 200b verifies whether each third test path is in discontinuity, with the probe 300 not in contact with any of the head pads P. In a case where any of the third test paths is in continuity, it is estimated that an unintended short circuit has occurred. Thus, it is determined that the inspection result shows rejection.

The probe 300 is in connection with the ground potential in the inspection device 200b. In a case where a third test path is formed with the probe 300 in contact with the six head pads P29 to P34, because the third test path is connected to the ground potential in the inspection device 200b, the third test path should be in continuity. The inspection device 200b verifies whether or not the six third test paths are each in continuity, with the six third test paths formed in individually different periods. In a case where any of the third test paths is in discontinuity, it is estimated that a disconnection or un-junction has occurred. Thus, it is determined that the inspection result shows rejection.

Note that, according to the example illustrated in FIG. 13, the six inspection circuits 150 are connected one-to-one to the six third test paths. One inspection circuit 150 may be shared among a plurality of third test paths. A switch may be provided between a plurality of third test paths and one inspection circuit 150, and a third test path may be selected as the destination of the one inspection circuit 150 by switching of the switch.

Figure 14:
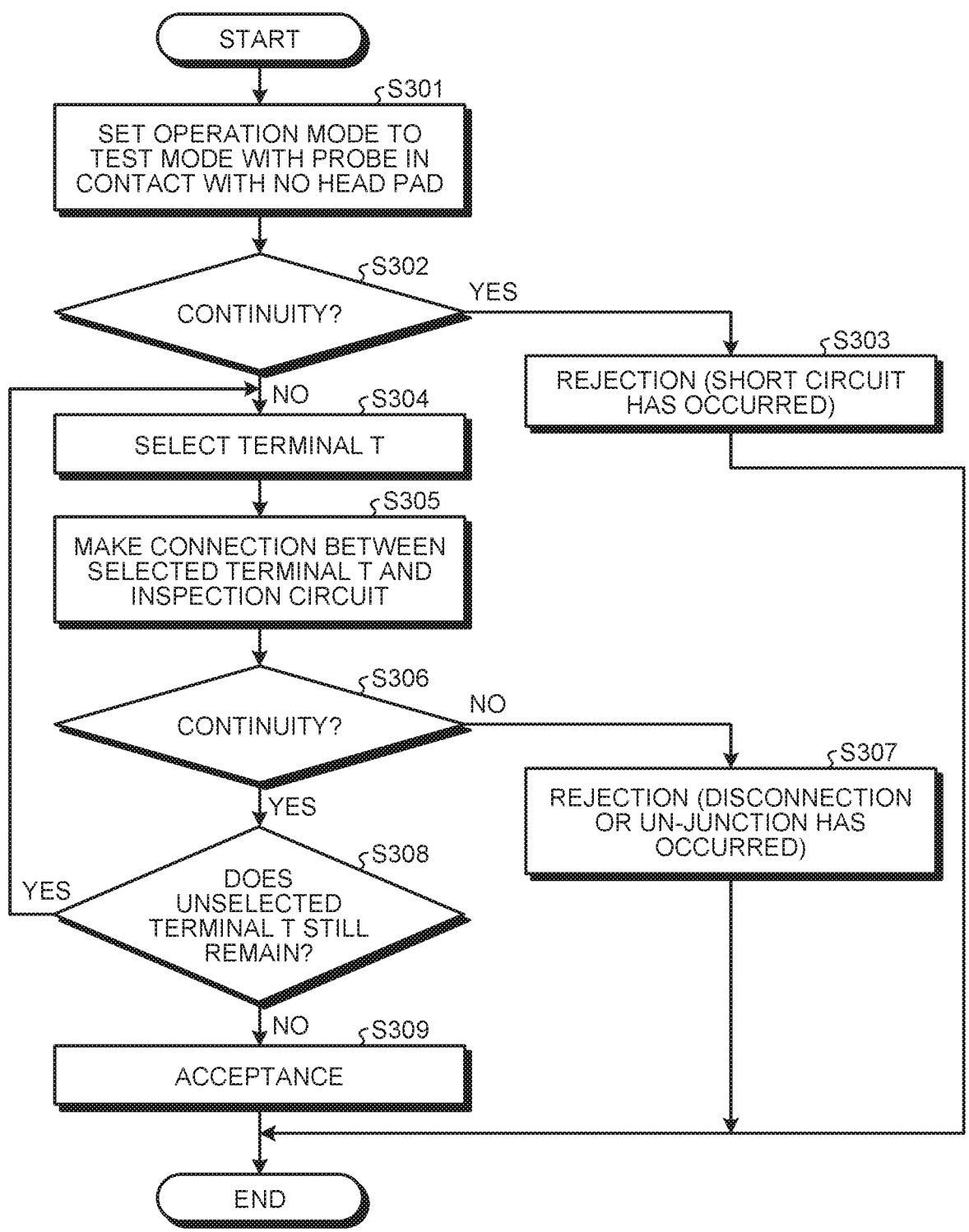
FIG. 14 is a flowchart illustrating an exemplary procedure of mounting inspection according to the third embodiment.

FIG. 14 is a flowchart illustrating an exemplary procedure of mounting inspection according to the third embodiment.

First, the inspection device 200b is connected to the preamplifier 100b on the FPC board 19b. Then, with the probe 300 not in contact with any of the head pads P, the inspection device 200b sets the operation mode of the preamplifier 100b to a test mode (S301). According to the example illustrated in FIG. 13, due to S301, six third test paths are formed.

Each inspection circuit 150 supplies current to the corresponding third test path and determines whether or not the corresponding third test path is in continuity (S302). Each inspection circuit 150 outputs the determination result as a detection signal. Each detection signal is directly output as a Fault signal to the inspection device 200b.

Because each third test path is not in connection with the ground potential, if the preamplifier 100b has been mounted normally, each third test path should be in discontinuity. If any of the third test paths is in continuity, it can be estimated that an unintended short circuit has occurred in the FPC board 19b.

In a case where any of the third test paths is in continuity (S302: Yes), the inspection device 200b determines that the inspection result according to the FPC board 19b shows rejection (S303). Then, the mounting inspection to the FPC board 19b finishes.

In a case where the third test paths are each in discontinuity (S302: No), the inspection device 200b selects one from the plurality of terminals T (S304). Then, with the probe 300 in contact with all the head pads P, the inspection device 200b makes a connection between the selected terminal T and the inspection circuit 150 (S305).

According to the third embodiment, for example, a mode control circuit 112 is capable of making connections between the plurality of terminals T and the inspection circuits 150 at individually different timings, on the basis of control information input through an SDATA terminal. The inspection device 200b causes the mode control circuit 112 to make a connection between the selected terminal T and the inspection circuit 150.

The selected terminal T is connected to the inspection circuit 150, so that the inspection circuit 150 is connected to the third test path to which the selected terminal T belongs. Because the third test path is in connection with the ground potential through the probe 300, if the preamplifier 100b has been mounted properly, the third test path should be in continuity.

The inspection circuit 150 connected to the selected terminal T supplies current to the third test path and determines whether or not the third test path is in continuity (S306). The inspection circuit 150 outputs the determination result as a detection signal. The detection signal is directly output as a Fault signal to the inspection device 200b.

In a case where the third test path including the selected terminal T is in discontinuity (S306: No), it is estimated that a disconnection or un-junction has occurred. Thus, the inspection device 200b determines that the inspection result according to the FPC board 19b shows rejection (S307). Then, the mounting inspection to the FPC board 19b finishes.

In a case where the third test path including the selected terminal T is in continuity (S306: Yes), the inspection device 200b determines whether or not an unselected terminal T still remains (S308). In a case where an unselected terminal T still remains (S308: Yes), the control proceeds to S304. Then, the inspection device 200b selects one terminal T from one or more terminals T that have not been selected yet.

In a case where all the terminals T have already been selected (S308: No), the inspection device 200b determines that the inspection result according to the FPC board 19b shows acceptance (S309). Then, the mounting inspection to the FPC board 19b finishes.

Note that the inspection device 200b may further carry out a different inspection, and may perform the processing in S309 in a case where no rejection is determined in all the inspections.

In the example described above, with all the head pads P short-circuited by the probe 300, electrical characteristics on the individual head pads P are detected in individually different periods. With at least two head pads P short-circuited by the probe 300, electrical characteristics on the at least two head pads P may be detected in individually different periods. Note that a larger number of head pads P to be short-circuited by the probe 300 and to be individually detected in electrical characteristic, facilitates mounting inspection and enables efficient mounting inspection. For example, the probe 300 may cover all head pads P included in the FPC board 19b at a time.

As described above, according to the third embodiment, with at least two head pads P short-circuited by the probe 300 in connection with the ground potential, the inspection circuits 150 supply electrical energy to the individually different third test paths to which the at least two head pads P belong, in individually different periods. Then, the inspection circuits 150 each detect an electrical characteristic of the third test path being supplied with the electrical energy.

Thus, with a plurality of head pads P in contact with the probe 300 at a time, an electrical characteristic on each individual head pad P can be detected. Making one probe 300 in contact with a plurality of head pads P is easier than making a probe in accurate contact with each head pad P, so that a stable inspection result can be acquired.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method comprising:
   supplying electrical energy to a first path by an inspection circuit with a short circuit between two first terminals through a first probe, the two first terminals being included in a plurality of second terminals included in a flexible printed circuit board, the plurality of second terminals being configured to be connected to a magnetic head, the flexible printed circuit board including: a preamplifier including the inspection circuit, a plurality of third terminals, and a plurality of switches, the preamplifier being configured to apply voltage to a magnetic head of the magnetic disk device through the plurality of third terminals; the plurality of second terminals; and a plurality of first wired lines connecting the plurality of second terminals and the plurality of third terminals, the first path being formed by: the two first terminals; two second wired lines connected to the two first terminals among the plurality of first wired lines; and two fourth terminals connected to the two second wired lines among the plurality of third terminals; and detecting an electrical characteristic on the first path by the inspection circuit when the electrical energy is supplied to the first path, wherein the method further comprises:

connecting the first path and a second path in series by the plurality of switches with the short circuit between the two first terminals through the first probe and with a short circuit between two fifth terminals different from the two first terminals among the plurality of second terminals through a second probe different from the first probe, the second path being formed by: the two fifth terminals, two third wired lines connected to the two fifth terminals among the plurality of first wired lines; and two sixth terminals connected to the two third wired lines among the plurality of third terminals, wherein the supplying includes supplying, by the inspection circuit, the electrical energy to a third path including the first path and the second path connected to the first path in series.

2. The method according to claim 1, wherein the connecting including connecting a seventh terminal among the two fourth terminals to an eighth terminal among the two sixth terminals.

3. A preamplifier comprising:

a plurality of first terminals configured to be connected to a magnetic head of a magnetic disk device;

a plurality of switches; and an inspection circuit that supplies electrical energy to a first path with a short circuit between two first terminals through a first probe, wherein the two first terminals being included in a plurality of second terminals included in a flexible printed circuit board, wherein the plurality of switches connect the first path and a second path in series with a short circuit through the first probe between two first wired lines connected to two second terminals among the plurality of first terminals and with a short circuit through a second probe between two second wired lines connected to two third terminals different from the two first terminals among the plurality of first terminals, the first path being formed by the two second terminals and the two first wired lines short-circuited each other, the second path formed by the two third terminals and the two second wired lines short-circuited each other, wherein the flexible printed circuit board includes the plurality of third terminal, the inspection circuit supplies electrical energy to a third path including the first path and the second path connected to the first path in series, and a detection circuit that detects an electrical characteristic on the third path when the electrical energy is supplied to the third path.

4. The preamplifier according to claim 3, wherein the switch connects a fourth terminal among the two second terminals to a fifth terminal among the two third terminals.

* * * * *